(12) United States Patent
Lowen (10) Patent No.: US 6,804,384 B2
(45) Date of Patent: Oct. 12, 2004

(54) COLOR MAGNETIC RESONANCE IMAGING

(75) Inventor: Steven B. Lowen, Burlington, MA (US)

(73) Assignee: McLean Hospital Corporation, Belmont, MA (US)

( * ) Notice: Subject to any disclaimer, the term of this patent is extended or adjusted under 35 U.S.C. 154(b) by 49 days.

(21) Appl. No.: 09/879,265

(22) Filed: Jun. 12, 2001

(65) Prior Publication Data

US 2003/0026467 A1 Feb. 6, 2003

(51) Int. Cl.$^7$ .............................. G06K 9/00; A61B 5/05
(52) U.S. Cl. ............................ 382/128; 378/4; 600/410
(58) Field of Search .................................. 382/100, 128, 382/129–134, 162, 165, 167; 324/303, 309; 378/4, 19, 62, 1; 600/306, 407, 409, 410, 425, 443

(56) References Cited

U.S. PATENT DOCUMENTS

| | | | |
|---|---|---|---|
| 4,103,541 A | | 8/1978 | Arai et al. .................. 73/88 R |
| 4,455,609 A | * | 6/1984 | Inamura et al. ........ 250/370.07 |
| 4,502,007 A | | 2/1985 | Mee et al. .................. 324/307 |
| 4,694,252 A | | 9/1987 | Riederer et al. ............ 324/309 |
| 4,729,100 A | | 3/1988 | Tsujii |
| 4,789,831 A | | 12/1988 | Mayo, Jr. ................... 324/309 |
| 4,868,843 A | * | 9/1989 | Nunan ........................ 378/152 |

(List continued on next page.)

OTHER PUBLICATIONS

Alfano et al., "Simultaneous Display of Multiple MR ...," Journal of Computer Assisted Tomography, 16(4):634–640, 1992.
Basser et al., "Estimation of the Effective Self–Diffusion ...," J. Magn. Reson. B., 103:247–254, 1994.
Basser et al., "MR Diffusion *Tensor* Spectroscopy and Imaging," Biophys J., 66:259–267, 1994.
Basser and Pierpaoli, "Microstructural and Physiological Features of Tissues ...," J. Magn. Reson. B., 111:209–219, 1996.
Bush et al., "Anterior Cingulate Cortex Dysfunction in ...," Biol. Psychiatry, 45:1542–1552, 1999.
Bushnell et al., "Pain perception: Is there a ...," Proc. Natl. Acad. Sci. USA, 96:7705–7709, 1999.
Droege et al., "Nuclear Magnetic Resonance: A Gray ...," Radiology, 148:763–771, 1983.
Kamman et al., "Unified Multiple–Feature Color Display ...," Magnetic Resonance in Medicine, 9:240–253, 1989.
Kamman and Berendsen, "Multiple–Feature Color Display for ...," Science and Engineering of Medical Imaging, 1137:120–123, 1989.
Pierpaoli and Basser, "Toward a Quantitative Assessment of ...," Magnetic Resonance in Medicine, 36:893–906, 1996.
Pierpaoli, "One More Method for Color Mapping ...," 5$^{th}$ ISMRM, 3:1741, 1997.
Pierpaoli et al., "Diffusion Tensor Imaging of the Human Brain," Radiology, 201:637–648, 1996.

*Primary Examiner*—Jayanti K. Patel
(74) *Attorney, Agent, or Firm*—Fish & Richardson P.C.

(57) ABSTRACT

The invention involves color magnetic resonance imaging using both a magnetic resonance property and a function of the magnetic resonance property. These enhanced color images provide greater informational content to the viewer. Applications include color imaging of estimates of $T_2$ to distinguish between regions of a sample containing homogeneous tissue and regions containing mixtures of tissue by using spatial variation in the hue, brightness, or saturation of the colors.

43 Claims, 5 Drawing Sheets

(4 of 5 Drawing Sheet(s) Filed in Color)

U.S. PATENT DOCUMENTS

| | | | |
|---|---|---|---|
| 4,961,425 A | 10/1990 | Kennedy et al. | |
| 4,991,092 A | 2/1991 | Greensite | 364/413.13 |
| 4,998,165 A | 3/1991 | Lindstrom | 358/81 |
| 5,003,979 A | 4/1991 | Merickel et al. | |
| 5,025,216 A | 6/1991 | Pauly et al. | 324/309 |
| 5,068,610 A | 11/1991 | Mehlkopf et al. | 324/312 |
| 5,150,053 A | 9/1992 | Pauly et al. | 324/309 |
| 5,152,607 A | 10/1992 | Ibar | 374/45 |
| 5,255,978 A | 10/1993 | Ibar | 374/45 |
| 5,281,914 A * | 1/1994 | Conturo et al. | 324/309 |
| 5,289,124 A | 2/1994 | Jerosch-Herold et al. | 324/303 |
| 5,289,520 A | 2/1994 | Pellegrino et al. | |
| 5,332,968 A | 7/1994 | Brown | 324/309 |
| 5,343,390 A | 8/1994 | Doi et al. | |
| 5,353,794 A | 10/1994 | Miyazaki | 128/653.2 |
| 5,387,864 A | 2/1995 | Gershenson et al. | 324/248 |
| 5,410,250 A | 4/1995 | Brown | |
| 5,426,684 A | 6/1995 | Gaborski et al. | |
| 5,465,718 A | 11/1995 | Hochman et al. | |
| 5,486,763 A | 1/1996 | Alfano | 324/309 |
| 5,488,297 A * | 1/1996 | Nakada | 324/309 |
| 5,578,923 A | 11/1996 | Chen | 324/309 |
| 5,583,346 A | 12/1996 | Nakajima | |
| 5,590,215 A * | 12/1996 | Allen | 382/128 |
| 5,720,288 A * | 2/1998 | Liu | 600/453 |
| 5,774,599 A | 6/1998 | Muka et al. | |
| 5,847,403 A * | 12/1998 | Hughes et al. | 250/505.1 |
| 5,860,921 A | 1/1999 | Ma et al. | 600/410 |
| 5,997,472 A | 12/1999 | Bonnell et al. | 600/109 |
| 6,345,114 B1 * | 2/2002 | Mackie et al. | 382/132 |
| 6,396,270 B1 * | 5/2002 | Smith | 324/309 |

* cited by examiner

COLOR MAGNETIC RESONANCE IMAGING

TECHNICAL FIELD

This invention relates to color magnetic resonance imaging.

BACKGROUND

In traditional magnetic resonance imaging (MRI), a patient lies within a tubular structure where the patent is subjected to spatial and temporal magnetic field gradients. MRI uses the fact that atomic nuclei spin to collect image data. If the number of protons in a nucleus is even, their spins will cancel; however, if there is an odd number, there will be a net spin that can be used to conduct MRI, see, e.g., U.S. Pat. No. 5,397,987, which is incorporated by reference herein. Hydrogen nuclei have a single proton, and many MRI techniques utilize hydrogen nuclei since they are pervasive in human tissue. When a subject is placed in a main magnetic field, its nuclei align in the direction of the field (i.e., along the "magnetization axis"); the orientation of the nuclei can be represented by a magnetization vector, see, e.g., Horowitz, *MRI Physics for Radiologists: A Visual Approach,* 1995, which is incorporated by reference herein. These spinning nuclei can precess in a conical manner around the magnetization axis, generally out-of-phase with respect to each other. To induce in-phase spinning at the resonance frequency of particular nuclei, a radio frequency (RF) excitation pulse is broadcast at that resonance frequency. This RF pulse also causes the nuclei to rotate with respect to the magnetization vector created by the main magnetic field, see, e.g., Horowitz, *MRI Physics for Radiologists: A Visual Approach,* 1995, incorporated by reference herein. After the RF excitation pulse, free induction decay (FID) signals are collected and used to generate MR images.

There are two major forms of relaxation, or decay, in MRI: a longitudinal component and a transverse component, see, e.g., E. Fukushima and S. Roeder, *Experimental Pulse NMR—A Nuts and Bolts Approach,* 1981, incorporated herein by reference. One form of relaxation is "de-phasing" of the nuclear spins over time after the RF pulse. This phenomenon is known as the "transverse relaxation" (or spin-spin relaxation), and the time constant for this relaxation is labeled $T_2$. The other form of relaxation is the realignment of the magnetization vectors along the main magnetic field. This is known as the "longitudinal relaxation" (or spin-lattice relaxation), and the time constant for this relaxation is labeled $T_1$. Both of these relaxation phenomena are characterized by exponential decay.

MR images are generated from the FID signals. These images are often in black and white. Techniques are also known for producing gray scale images using $T_1$, $T_2$, and proton density data, see, e.g., Ronald T. Droege et al., "Nuclear Magnetic Resonance: A Gray Scale Model for Head Images," *Radiology,* 148:763–771 (1983). There are also methods for generating color images. One approach is to convert a monochrome image into one that is in color, see U.S. Pat. No. 4,998,165. Other approaches to producing color images take both $T_1$ and $T_2$ data as inputs and use specified methods to render color images, see, e.g., U.S. Pat. Nos. 5,486,763; 5,410,250; 4,789,831.

SUMMARY

In one aspect of the invention, an article containing a computer-readable medium on which a computer program is stored has instructions for causing a processor to receive spatial magnetic resonance data obtained from a sample and generate color image data using the magnetic resonance data. The color image data reflect both a magnetic resonance property of the magnetic resonance data and a function of the magnetic resonance property. This invention permits a user to evaluate the magnetic resonance property of the sample to ascertain the spatial composition of the sample.

Embodiments of this aspect of the invention include one or more of the following features. The function can be selected to enhance the color image data. This enhancement is the result of providing greater informational content. For example, the function of the magnetic resonance property can enhance the color image by indicating the confidence level of the magnetic resonance property. The function can be selected to enhance at least one region of a color image produced from the color image data. This region is enhanced on the basis of hue, brightness, or saturation. By using hue, brightness, or saturation to enhance the color image by indicating, e.g., the confidence level of a magnetic resonance property, the color image facilitates quick and easily comprehension of this information by a researcher or clinician. The function can also be selected to distinguish at least one region of the color image on the basis of the composition of the material in the corresponding region of the sample. This is useful, e.g., to identify regions where a probe passes through tissue in a sample. In addition, the function can be selected to distinguish at least one region of the color image on the basis of the presence of material in the corresponding region of the sample. The function can be further selected to distinguish at least one region of the color image on the basis of the homogeneity of material in the corresponding region of the sample. Distinguishing on the basis of the homogeneity of material in a region of the sample permits a user of the color image to differentiate between regions containing homogenous tissue and regions containing a mixture of tissue.

The magnetic resonance data are obtained using a Fourier transform of free induction decay signals. The magnetic resonance property can be an estimate of $T_2$, $T_1$, or thermal relaxation. By using a single parameter, this technique exploits the particular advantages of that magnetic resonance property, such as the sensitivity $T_2$ to time-dependent changes. Since $T_2$ is affected by metabolic changes in the brain, $T_2$ can be used for functional MRI, e.g., to track changes over time, through treatment regimens, between or among subjects, or a combination thereof. For example, this approach can be used to monitor levels of drugs or other chemicals in the blood or other tissues over time. The estimate of $T_2$, $\hat{T}_2$, is calculated using:

$$\hat{T}_2 = \frac{\sigma_t^2}{C_{x,t}}, \text{ where}$$

$$\sigma_t = N^{-1} \sum_{n=0}^{N-1} t_n^2 - \left(N^{-1} \sum_{n=0}^{N-1} t_n\right)^2,$$

$$I_N = N^{-1} \sum_{n=0}^{N-1} x_n - \frac{N^{-1} \sum_{n=0}^{N-1} t_n}{\hat{T}_2},$$

and where N is a number of echo times, $t_n$, and $x_n = \ln(y_n)$ for $y_n > 0$; otherwise, $x_n = -1$, and where $y_n$ is an intensity of a signal at an echo time, $t_n$. Using specially chosen echo times, direct values of signal intensity, $y_n$, rather than their natural logarithms, can be used for $x_n$, and a value other than $-1$ could be used for negative $y_n$.

The function of the magnetic resonance property can be a function of fit of the $T_2$ data to a reference curve. Including this characteristic of the $T_2$ data in the color image allows a viewer to distinguish between a voxel with a single type of tissue with a particular $T_2$ and a voxel with different tissues that together yield that $T_2$. This fit, E, can be calculated using:

$$E = \frac{\left(\sigma_x^2 - C_{x,t}/\hat{T}_2\right)^{1/2}}{I_N},$$

and the following additional relationships, $$\sigma_x = N^{-1}\sum_{n=0}^{N-1} x_n^2 - \left(N^{-1}\sum_{n=0}^{N-1} x_n\right)^2,$$

$$C_{x,t} = N^{-1}\sum_{n=0}^{N-1} x_n t_n - \left(N^{-1}\sum_{n=0}^{N-1} x_n\right)\left(N^{-1}\sum_{n=0}^{N-1} t_n\right).$$

The function can also be a function of intensity. Display of intensity information permits one to distinguish readily between voxels containing mostly air and those containing tissue. The intensity, $I_N$, can be calculated using:

$$I_N = N^{-1}\sum_{n=0}^{N-1} x_n - \frac{N^{-1}\sum_{n=0}^{N-1} t_n}{\hat{T}_2}.$$

The instructions can include both a function of fit of the first data to a reference curve and a function of intensity. The preceeding equations can be used to calculate them, or a threshold measure can be used to eliminate a pre-determined range of values. This provides the user with the useful information provided by both characteristics of the $T_2$ data. The estimate of $T_2$, the fit of the first data to the reference curve, and the intensity are used to calculate hue, saturation, and brightness. Using these three parameters, the color images provide a greater depth of information than available in grayscale images. The hue, H; saturation, S; and brightness, V, are calculated using:

$$H=[1+(\hat{T}_2/T_0)^2]^{-1/2},$$

S=0 for $E \geq \frac{1}{2}$, S=1−2E for $\frac{1}{2} < E < 0$, and S=1 for $E \leq 0$, and V=0 for $I_N \leq 0$, V=$I_N$/8 for $0 < I_N < 8$, and V=1 for $I_N \geq 8$, where $T_0$ is a constant. In this intuitive approach, bright colors represents high intensity and dim colors represent weak intensity. These equations can be tweaked to enhance the color display depending on the range of values obtained for the estimates of $T_2$, goodness-of-fit, and intensity.

The color image data are in RGB format. This renders the data suitable for convenient display on computer monitors and storage in cross-platform image files (e.g., JPEG, TIFF, PPM files). The individual color values in the color image data are given by:

$R=MV[1+S\cos(\theta)],$ $G=MV[1+S\cos(\theta-\phi)],$ $B=MV[1+S\cos(\theta+\phi)],$ using the following additional relationship, $$M = \frac{(2^b - 1)}{c},$$

wherein b is the number of bits per voxel and c is the number of colors. These equations can be adjusted to enhance the user's ability to distinguish between different types of tissues, e.g., white and gray matter in the human brain. The images can also be used to ascertain the porosity of $T_2$ data or investigate samples described by the Arrhenius equation.

In another aspect, the invention includes a method of color imaging that involves receiving spatial magnetic resonance data obtained from a sample and generating color image data using the magnetic resonance data. The color image data reflect both a magnetic resonance property of the magnetic resonance data and a function of the magnetic resonance property.

Yet another aspect involves a color imaging system that has a magnetic resonance scanner, a receiver, and a processor. The processor receives spatial magnetic resonance data obtained from a sample and generates color image data using the magnetic resonance data. The color image data reflect a magnetic resonance property of the magnetic resonance data and a function of the magnetic resonance property.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments of the invention are set forth in the accompanying drawings and the description below. Other features, objects, and advantages of the invention will be apparent from the description and drawings, and from the claims.

DESCRIPTION OF DRAWINGS

The file of this patent contains at least one drawing executed in color. Copies of this patent with color drawings will be provided by the Patent and Trademark Office upon request and payment of the necessary fee.

DETAILED DESCRIPTION

System

Figure 1:
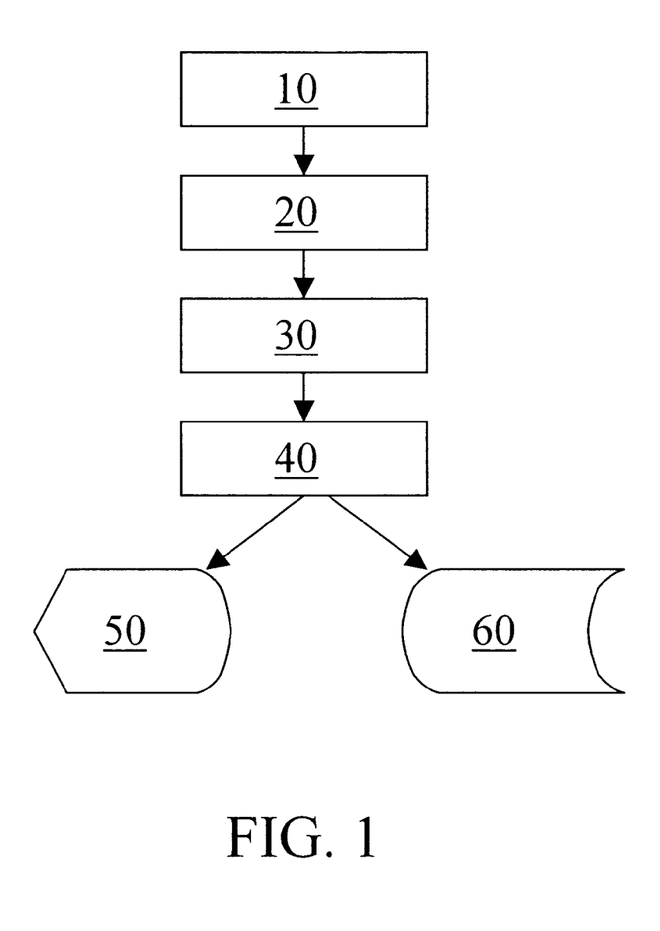
FIG. 1 is a block diagram of a system for using the present invention.

A block diagram of a color imaging system according to the present invention is shown in FIG. 1. The system has a magnetic resonance (MR) scanner 10, a receiver 20, a primary processor 30, a secondary processor 40, a display 50, and a storage medium 60. The MR scanner 10 is a 1.5 Tesla MR scanner (Signa; General Electric Medical Systems, Milwaukee, Wis.) equipped with a whole-body, resonant-gradient set capable of echo planar imaging (Advanced NMR systems, Wilmington, Mass.). The receiver 20 is a standard "quadrature" head coil. The primary processor 30 and the secondary processor 40 are computers. The display device 50 either shows the color image on a screen or prints it to a slide or paper. The color image data are also stored on a storage medium 60, a hard disk drive.

Operation

The MR scanner 10 applies a magnetic resonance imaging sequence for spin echo, echoplanar imaging of a sample (e.g., a human subject, not shown). The echo times, $t_n$, in this sequence are on the order of milliseconds (e.g., 4 milliseconds), and the sequence is repeated a number of times, with the time between repetitions, TR, on the order of several seconds (e.g., 10 seconds). The receiver 20 collects FID signals, $y_n$, from excited nuclei in the sample. The primary processor 30 uses a fast Fourier transform to process the FID signals, and outputs the resultant to the secondary processor 40, a personal computer which generates the color image data D. The color image data D are stored as PPM files on the storage medium 60, and displayed on the display device 50, a computer monitor.

The color image data D reflect both $T_2$ values and functions of these $T_2$ values. Accordingly, the color image data D can be expressed as a function, $f$, of the estimates of $T_2$ and functions, $g$, of these $T_2$ estimates:

$$D = f(T_2, g_1(T_2), \ldots, g_n(T_2)),$$

where n is the number of functions, g, of $T_2$ used to generate the color image data. These functions of the $T_2$ data enhance the color image, relative to a color image displaying only the $T_2$ data. For example, one function can be a characteristic of the "goodness-of-fit" of the $T_2$ data to an ideal exponential decay. In this case, the color image indicates the degree of homogeneity of the a tissue in sample (i.e., whether the region of the sample corresponding to a given voxel is composed of a single tissue type, or a mixture of tissue). In addition or alternatively, where the function is a characteristic of intensity, the color image facilitates identification of regions where there is mostly tissue, versus regions where there is mostly air.

Data Processing

For each voxel, the intensity of the FID signal, $y_n$, and the echo time, $t_n$, are used to create a color representation of the data for that voxel. A parameter x, is defined, using ln to represent the natural logarithm function, as $$x_n = ln(y_n) \text{ for } y_n > 0; \text{ otherwise, } x_n = -1. \tag{1}$$

The average value of x is denoted as $\langle x \rangle$, and this quantity is given by $$\langle x \rangle = N^{-1} \sum_{n=0}^{N-1} x_n, \text{ where } N \text{ is the number of echo times.} \tag{2}$$

The average of the square of x, $\langle x^2 \rangle$, is therefore $$\langle x^2 \rangle = N^{-1} \sum_{n=0}^{N-1} x_n^2. \tag{3}$$

Another parameter, $\sigma_x$, represents the deviation in x, is described by the equation $$\sigma_x = \langle x^2 \rangle - \langle x \rangle^2. \tag{4}$$

The average echo time $\langle t \rangle$ is similarly defined as:

$$\langle t \rangle = N^{-1} \sum_{n=0}^{N-1} t_n \text{ and} \tag{5}$$

$$\langle t^2 \rangle = N^{-1} \sum_{n=0}^{N-1} t_n^2. \tag{6}$$

The measure of deviation in echo time, $\sigma_t$, is given by $$\sigma_t = \langle t^2 \rangle - \langle t \rangle^2. \tag{7}$$

Consequently, the quantity $\langle xt \rangle$ is described by the equation $$\langle xt \rangle = N^{-1} \sum_{n=0}^{N-1} x_n t_n. \tag{8}$$

Another parameter, $C_{x,t}$, is given by $$C_{x,t} = \langle xt \rangle - \langle x \rangle \langle t \rangle. \tag{9}$$

Where the echo times are equally spaced, the equations involving t can be simplified. Using $t_m$ to represent the minimum echo time and $t_s$ to represent the spacing between the echo times, the equations for $\langle t \rangle$, $\langle t^2 \rangle$, and $\sigma_t$ respectively can be rewritten without summation as $$\langle t \rangle = t_m + \frac{(N-1)t_s}{2}, \tag{10}$$

$$\langle t^2 \rangle = t_m^2 + (N-1)t_m t_s + \frac{(N-1)(2N-1)t_s^2}{6}, \text{ and} \tag{11}$$

$$\sigma_t^2 = \frac{(N^2-1)t_s^2}{12}. \tag{12}$$

Three main quantities are estimated using these equations: a normalized intensity level $I_N$, a goodness-of-fit measure E, and the estimated relaxation time $\hat{T}$ itself. The estimated relaxation, or decay, time $\hat{T}$ represents the main quantity of interest, while $I_N$ and E are functions of $\hat{T}$ that are useful to evaluate this main quantity of interest. $I_N$ represents intensity and E represents how well the graph of intensity over time follows the ideal exponential form for decay. Where the color image is generated using $T_2$ data, the estimated relaxation time can be written as $\hat{T}_2$. The quantities $\hat{T}_2$, $I_N$, and E are respectively given by $$\hat{T}_2 = \frac{\sigma_t^2}{C_{x,t}}, \tag{13}$$

$$I_N = \langle x \rangle - \frac{\langle t \rangle}{\hat{T}_2}, \text{ and} \tag{14}$$

$$E = \frac{(\sigma_x^2 - C_{x,t}/\hat{T}_2)^{1/2}}{I_N}. \tag{15}$$

$I_N$ and E can both be expressed directly as a function of $x_n$ and $t_n$ by substituting equation (13) into equations (14) and (15).

A small value of $I_N$ suggests that the voxel of interest contains mostly air, and thus does not present useful data. Similarly, a large value of E usually arises from a voxel with a mixed composition, leading to differing decay times and an overall non-exponential decay (non-exponential decay can also result from a voxel containing air, which essentially yields noise). Using a color image, the $\hat{T}_2$ data are displayed along with the information about its characteristics provided by $I_N$ and E. The estimate of $T_2$ decay time, $\hat{T}_2$, determines the color, or hue H; the intensity $I_N$ determines the brightness, or value V; and the error E determines the saturation S. The following transformations are used to compute H, V, and S for the $T_2$ values of interest in one scan for which $T_2$ roughly spans 40 to 120 milliseconds:

$H=[1+(\hat{T}_2/T_0)^2]^{-1/2}$, where $T_0$ is set to a fixed value, e.g., 60 milliseconds; (16)

$S=0$ for $E \geq \frac{1}{2}, S=1-2E$ for $\frac{1}{2}<E<0$, and $S=1$ for $E \leq 0$; (17)

$V=0$ for $I_N \leq 0, V=I_N/8$ for $0<I_N<8$, and $V=1$ for $I_N \geq 8$. (18)

Thus, the values of H, S, and V lie between 0 and 1. The transformation for hue was empirically selected to achieve a roughly uniform distribution of hues. The equations for S and V were similarly chosen to optimize the resulting color images.

The hue, saturation, and brightness are used to generate the individual red R, green G, and blue B colors that comprise standard RGB-formatted images (e.g., a JPEG, PPM, or TIFF file). A parameter, $\theta$, and a constant, $\phi$, are introduced to simplify the equations for the individual colors:

$$\theta = \frac{5\pi H}{3} \text{ and} \tag{19}$$

$$\phi = \frac{2\pi}{3}. \tag{20}$$

The factor of $5\pi/3$ in the equation for $\theta$ and the value of $2\pi/3$ for the constant $\phi$ were chosen to optimize the color images.

Using $\theta$ and $\phi$, the equations for the colors thus can be written as:

$R=MV[1+S\cos(\theta)]$, (21)

$G=MV[1+S\cos(\theta-\phi)]$, and (22)

$B=MV[1+S\cos(\theta+\phi)]$. (23)

In these equations, M represents the maximum brightness, which is given by $$M = \frac{(2^b - 1)}{c}, \tag{24}$$

where b is the number of bits per voxel, e.g., eight bits, and c is the number of colors. Since there are three colors here, c=3. Using eight bits per voxel and three colors, M=85. With these transformations, the longest $T_2$ values are represented by red, medium values are displayed as green, and the shortest $T_2$ values are shown as blue. This parallels the spectrum for visible light, where the longest wavelengths are red, medium wavelengths are green, and the shortest are blue.

EXAMPLES

The present techniques have been used to generate a number of color images with varied parameters. FIGS. 2 through 10 are images from TIFF files that were generated using $T_2$ data obtained using an MR sequence for spin echo, echoplanar imaging. The echo times were equally spaced, and therefore the simplified equations (10) through (12) could be used. FIGS. 2 through 9 are images of 20 cm by 20 cm areas of a human brain, and each of the five slices is 3 mm thick, with 10 mm between slices. The slices range from I18 to S34.

FIGS. 2 through 5 illustrate the effect of decreasing the repetition time (TR) between scanning sequences. These figures are 64 by 64 voxel water images generated using 32 echo times spaced by a separation time of 4 ms. The repetition times for the figures are as follows: for FIG. 2, TR=10 s, for FIG. 3, TR=5 s, for FIG. 4, TR=2 s, and for FIG. 5, TR=1 s. The decrease in image quality from FIG. 1 to FIG. 5 as TR decreases is apparent. Decreasing TR makes discriminating between white and gray matter in the brain progressively more difficult.

Figure 2:
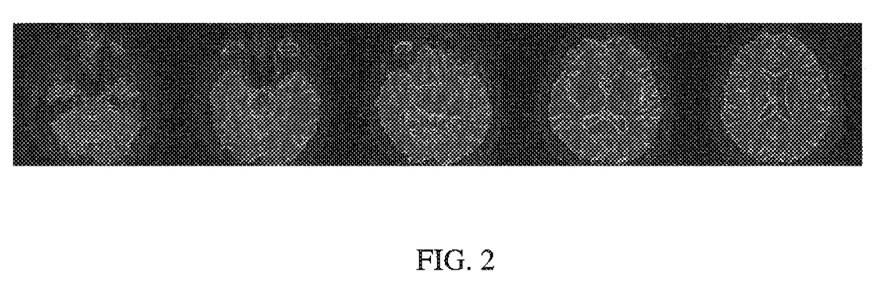
FIG. 2 is a set of images of five slices of a human brain generated using the present invention from a magnetic resonance imaging sequence using a repetition time of 10 seconds and echo times of 32 steps of 4 milliseconds each.
Figure 3:
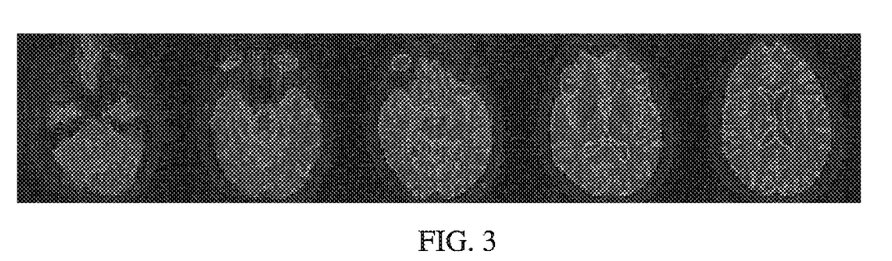
FIG. 3 is a set of 64×64 voxel images of five slices of a human brain generated using the present invention from a magnetic resonance imaging sequence using a repetition time of 5 seconds and echo times of 32 steps of 4 milliseconds each.
Figure 4:
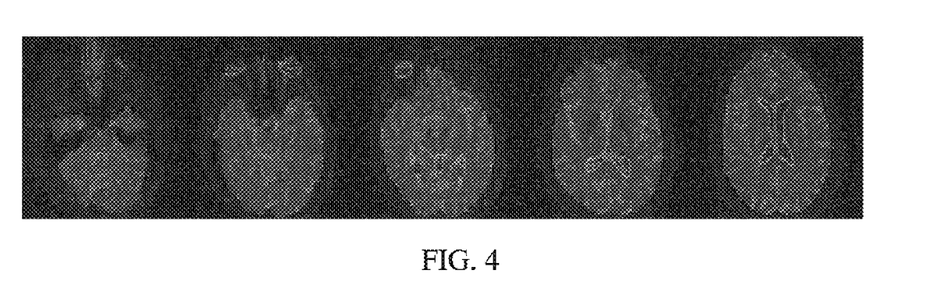
FIG. 4 is a set of 64×64 voxel images of five slices of a human brain generated using the present invention from a magnetic resonance imaging sequence using a repetition time of 2 seconds and echo times of 32 steps of 4 milliseconds each.
Figure 5:
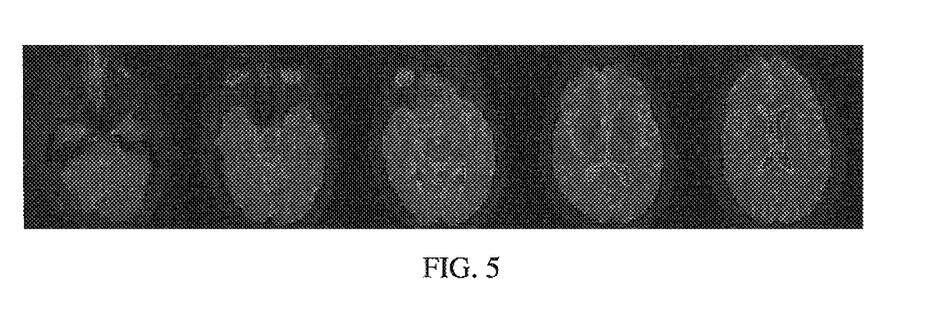
FIG. 5 is a set of 64×64 voxel water images of five slices of a human brain generated using the present invention from a magnetic resonance imaging sequence using a repetition time of 1 seconds and echo times of 32 steps of 4 milliseconds each.
Figure 6:
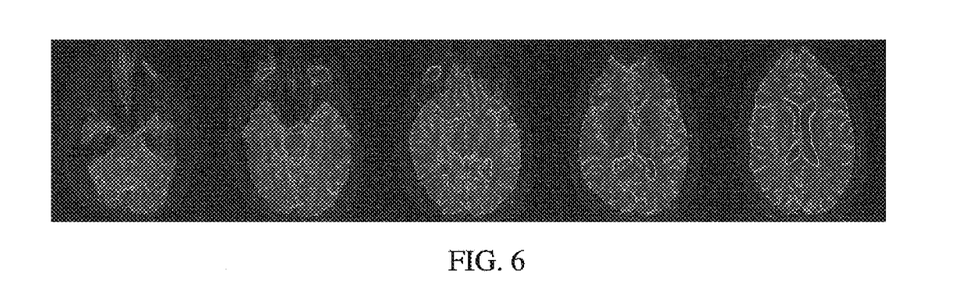
FIG. 6 is a set of 128×128 voxel water images of five slices of a human brain generated using the present invention from a magnetic resonance imaging sequence using a repetition time of 10 seconds and echo times of 32 steps of 4 milliseconds each.

FIG. 6 shows how increasing resolution affords improved differentiation of brain structures. This figure shows a 128 by 128 voxel water image using TR=10 s and 32 steps of 4 ms. The only difference between FIG. 6 and FIG. 2 is the increase in the number of voxels, and these two figures can be directly compared to assess the improvement that increasing the number of voxels provides.

Figure 7:
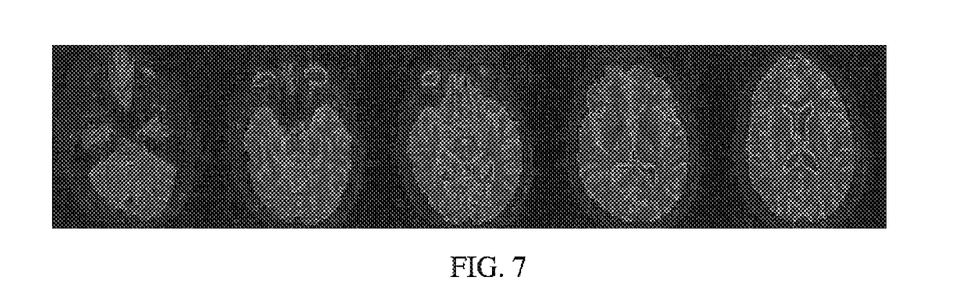
FIG. 7 is a set of 64×64 voxel water images of five slices of a human brain generated using the present invention from a magnetic resonance imaging sequence using a repetition time of 10 seconds and echo times of 128 steps of 1 millisecond each.

FIG. 7 shows that increasing the number of echo times for which data are obtained reduces noise in the images. To generate this figure, data for the 64 by 64 voxel water image were obtained using 128 echo times spaced 1 ms using TR=10 s. Comparing FIG. 7 to FIG. 2 shows that increasing the number of echo times from 32 to 128 enhances image quality through noise reduction.

Figure 8:
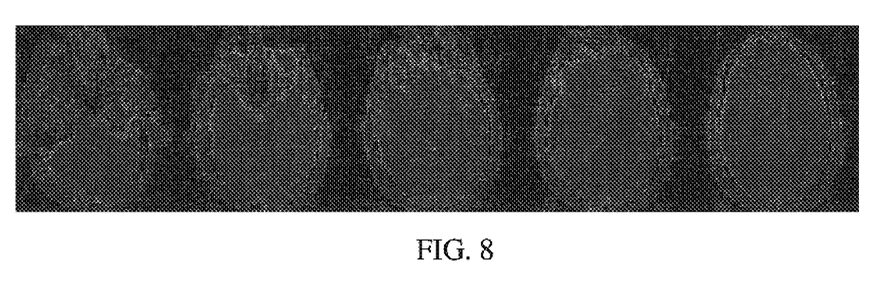
FIG. 8 is a set of 64×64 voxel water images of five slices of a human brain generated using the present invention from a magnetic resonance imaging sequence using a repetition time of 10 seconds and echo times of 32 steps of 0 milliseconds each.

FIG. 8 shows the effect of using an imaging protocol with 32 steps of 0 ms each, but supplying the processing algorithm with parameters identical to those of FIGS. 2–5. Areas where tissue is present are shown as red while areas where tissue is absent are black in this 64 by 64 voxel water image generated with TR=10 s. In this case, $y_n$ and therefore $x_n$ do not change; the algorithm correctly interprets this as a $T_2$ of infinity, and yields red pixels accordingly.

Figure 9:
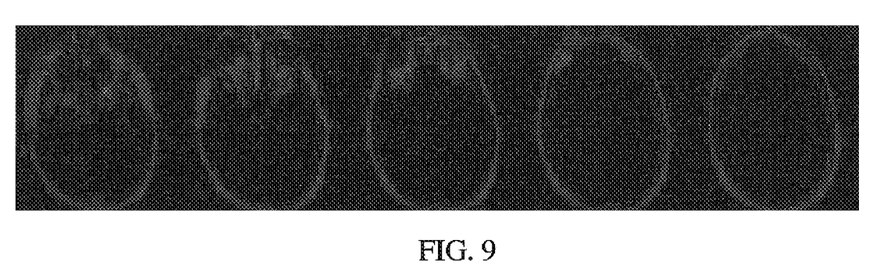
FIG. 9 is a set of 64×64 voxel fat images of five slices of a human brain generated using the present invention from a magnetic resonance imaging sequence using a repetition time of 5 seconds and echo times of 32 steps of 4 milliseconds each.

FIG. 9 demonstrates that the present color imaging techniques are not limited to water images. This figure is a 64 by 64 voxel fat image generated with 32 steps of 4 ms with TR=5 s. Comparing FIG. 9 to FIG. 3, which also used TR=5 s, shows the difference between a water and a fat image created using the present techniques.

A number of embodiments of the invention have been described. Nevertheless, it will be understood that various modifications may be made without departing from the spirit and scope of the invention. For example, the present techniques could be used to render color images of $T_1$ data. Accordingly, other embodiments are within the scope of the following claims.

What is claimed is:

1. An article comprising a computer-readable medium on which a computer program is stored, the computer program comprising instructions for causing a processor to:
   (a) receive signals containing magnetic resonance information about a sample;
   (b) perform a transform of the signals to generate magnetic resonance data and
   (c) generate color image data using the magnetic resonance data, wherein the color image data reflect:
      (i) an estimate of a magnetic resonance property of the sample; and
      (ii) a characteristic of the magnetic resonance property.

2. The article of claim 1, wherein the characteristic is selected to enhance the color image data.

3. The article of claim 2, wherein the characteristic is selected to enhance at least one region of a color image produced from the color image data.

4. The article of claim 3, wherein the at least one region is enhanced on the basis of at least one of hue, brightness, and saturation.

5. The article of claim 3, wherein the characteristic is selected to distinguish at least one region of the color image on the basis of the composition of the material in the corresponding region of the sample.

6. The article of claim 5, wherein the characteristic is selected to distinguish at least one region of the color image on the basis of the presence of material in the corresponding region of the sample.

7. The article of claim 5, wherein the characteristic is selected to distinguish at least one region of the color image on the basis of the homogeneity of material in the corresponding region of the sample.

8. The article of claim 1, wherein the magnetic resonance data are obtained using a Fourier transform of free induction decay signals.

9. The article of claim 1, wherein the estimate of the magnetic resonance property is an estimate of $T_2$.

10. The article of claim 9, wherein the estimate of $T_2$, $\hat{T}_2$, is calculated using:

$$\hat{T}_2 = \frac{\sigma_t^2}{C_{x,t}}, \text{ wherein}$$

$$\sigma_t = N^{-1} \sum_{n=0}^{N-1} t_n^2 - \left(N^{-1} \sum_{n=0}^{N-1} t_n\right)^2,$$

$$I_N = N^{-1} \sum_{n=0}^{N-1} x_n - \frac{N^{-1} \sum_{n=0}^{N-1} t_n}{\hat{T}_2},$$

and wherein

N is a number of echo times, $t_n$, and $x_n = \ln(y_n)$ for $y_n > 0$; otherwise, $x_n = -1$, and wherein $y_n$ is an intensity of a signal at an echo time, $t_n$.

11. The article of claim 9, wherein the characteristic is a goodness of fit of the estimate of $T_2$ to a reference curve.

12. The article of claim 11, wherein the characteristic of the goodness of fit to a reference curve, E, is calculated using:

$$E = \frac{\left(\sigma_x^2 - C_{x,t}/\hat{T}_2\right)^{1/2}}{I_N}, \text{ and wherein}$$

$$\sigma_x = N^{-1} \sum_{n=0}^{N-1} x_n^2 - \left(N^{-1} \sum_{n=0}^{N-1} x_n\right)^2,$$

$$C_{x,t} = N^{-1} \sum_{n=0}^{N-1} x_n t_n - \left(N^{-1} \sum_{n=0}^{N-1} x_n\right)\left(N^{-1} \sum_{n=0}^{N-1} t_n\right),$$

$$\hat{T}_2 = \frac{\sigma_t^2}{C_{x,t}},$$

$$\sigma_t = N^{-1} \sum_{n=0}^{N-1} t_n^2 - \left(N^{-1} \sum_{n=0}^{N-1} t_n\right)^2$$

$$I_N = N^{-1} \sum_{n=0}^{N-1} x_n - \frac{N^{-1} \sum_{n=0}^{N-1} t_n}{\hat{T}_2},$$

and wherein

N is a number of echo times, $t_n$, and $x_n = \ln(y_n)$ for $y_n > 0$; otherwise, $x_n = -1$, and wherein $y_n$ is an intensity of a signal at an echo time, $t_n$.

13. The article of claim 9, wherein the characteristic is a measure of intensity.

14. The article of claim 13, wherein the measure of intensity, $I_N$, is calculated using:

$$I_N = N^{-1} \sum_{n=0}^{N-1} x_n - \frac{N^{-1} \sum_{n=0}^{N-1} t_n}{\hat{T}_2}, \text{ wherein}$$

$$\hat{T}_2 = \frac{\sigma_t^2}{C_{x,t}},$$

$$\sigma_t = N^{-1} \sum_{n=0}^{N-1} t_n^2 - \left(N^{-1} \sum_{n=0}^{N-1} t_n\right)^2,$$

$$C_{x,t} = N^{-1} \sum_{n=0}^{N-1} x_n t_n - \left(N^{-1} \sum_{n=0}^{N-1} x_n\right)\left(N^{-1} \sum_{n=0}^{N-1} t_n\right),$$

and wherein

N is a number of echo times, $t_n$, and $x_n = \ln(y_n)$ for $y_n > 0$; otherwise, $x_n = -1$, and wherein $y_n$ is an intensity of a signal at an echo time, $t_n$.

15. The article of claim 9, further comprising two characteristics of the magnetic resonance property.

16. The article of claim 15, wherein the two characteristics are a goodness of fit to a reference curve and a measure of intensity.

17. The article of claim 16, wherein the estimate of $T_2$, the goodness of fit of the to the reference curve, and the measure of intensity are used to calculate hue, saturation, and brightness.

18. The article of claim 17, wherein the hue, H; saturation, S; and brightness, V, are calculated using:

$H = [1 + (\hat{T}^2/T_0)^2]^{-1/2}$, $S = 0$ for $E \geq \frac{1}{2}$, $S = 1 - 2E$ for $\frac{1}{2} < E < 0$, and $S = 1$ for $E \leq 0$, $V = 0$ for $I_N \leq 0$, $V = I_N/8$ for $0 < I_N < 8$, and $V = 1$ for $I_N \geq 8$, wherein $$\hat{T}_2 = \frac{\sigma_t^2}{C_{x,t}},$$

$$\sigma_t = N^{-1}\sum_{n=0}^{N-1} t_n^2 - \left(N^{-1}\sum_{n=0}^{N-1} t_n\right)^2,$$

$$C_{x,t} = N^{-1}\sum_{n=0}^{N-1} x_n t_n - \left(N^{-1}\sum_{n=0}^{N-1} x_n\right)\left(N^{-1}\sum_{n=0}^{N-1} t_n\right),$$

$$E = \frac{\left(\sigma_x^2 - C_{x,t}/\hat{T}_2\right)^{1/2}}{I_N},$$

$$\sigma_x = N^{-1}\sum_{n=0}^{N-1} x_n^2 - \left(N^{-1}\sum_{n=0}^{N-1} x_n\right)^2,$$

$$I_N = N^{-1}\sum_{n=0}^{N-1} x_n - \frac{N^{-1}\sum_{n=0}^{N-1} t_n}{\hat{T}_2},$$

and wherein $T_0$ is a constant, and wherein

N is a number of echo times, $t_n$, and $x_n = \ln(y_n)$ for $y_n > 0$; otherwise, $x_n = -1$, and wherein $y_n$ is an intensity of a signal at an echo time, $t_n$.

19. The computer-readable medium of claim 1, wherein the color image data are in RGB format.

20. The computer-readable medium of claim 12, wherein the individual color values in the color image data are given by:

$$R = MV[1+S\cos(\theta)],$$

$$G = MV[1+S\cos(\theta-\phi)],$$

$$B = MV[1+S\cos(\theta+\phi)],$$

$$M = \frac{(2^b - 1)}{c},$$

wherein b is the number of bits per voxel and c is the number of colors, and wherein $V = 0$ for $I_N \leq 0$, $V = I_N/8$ for $0 < I_N < 8$, and $V = 1$ for $I_N \geq 8$, $S = 0$ for $E \geq \frac{1}{2}$, $S = 1-2E$ for $\frac{1}{2} < E < 0$, and $S = 1$ for $E \leq 0$, and wherein $$E = \frac{\left(\sigma_x^2 - C_{x,t}/\hat{T}_2\right)^{1/2}}{I_N},$$

$$\sigma_x = N^{-1}\sum_{n=0}^{N-1} x_n^2 - \left(N^{-1}\sum_{n=0}^{N-1} x_n\right)^2,$$

$$C_{x,t} = N^{-1}\sum_{n=0}^{N-1} x_n t_n - \left(N^{-1}\sum_{n=0}^{N-1} x_n\right)\left(N^{-1}\sum_{n=0}^{N-1} t_n\right),$$

$$\hat{T}_2 = \frac{\sigma_t^2}{C_{x,t}},$$

$$\sigma_t = N^{-1}\sum_{n=0}^{N-1} t_n^2 - \left(N^{-1}\sum_{n=0}^{N-1} t_n\right)^2,$$

$$I_N = N^{-1}\sum_{n=0}^{N-1} x_n - \frac{N^{-1}\sum_{n=0}^{N-1} t_n}{\hat{T}_2},$$

$$\theta = \frac{5\pi H}{3}, \phi = \frac{2\pi}{3},$$

$H = [1+(\hat{T}_2/T_0)^2]^{-1/2}$, and wherein $T_0$ is a constant, and wherein N is a number of echo times, $t_n$, and $x_n = \ln(y_n)$ for $y_n > 0$; otherwise, $x_n = -1$, and wherein $y_n$ is an intensity of a signal at an echo time, $t_n$.

21. A method of color imaging comprising:
(a) receiving signals containing magnetic resonance information about a sample;
(b) performing a transform of the signals to generate magnetic resonance data and
(c) generating color image data using the magnetic resonance data, wherein the color image data reflect:
(i) an estimate of a magnetic resonance property of the sample; and
(ii) a characteristic of the magnetic resonance property.

22. The method of claim 21, wherein the characteristic is selected to enhance the color image data.

23. The method of claim 22, wherein the characteristic is selected to enhance at least one region of a color image produced from the color image data.

24. The method of claim 23, wherein the at least one region is enhanced on the basis of at least one of hue, brightness, and saturation.

25. The method of claim 23, wherein the characteristic is selected to distinguish at least one region of the color image on the basis of the composition of the material in the corresponding region of the sample.

26. The method of claim 25, wherein the characteristic is selected to distinguish at least one region of the color image on the basis of the presence of material in the corresponding region of the sample.

27. The method of claim 25, wherein the characteristic is selected to distinguish at least one region of the color image on the basis of the homogeneity of material in the corresponding region of the sample.

28. The article of claim 21, wherein the magnetic resonance data are obtained using a Fourier transform of free induction decay signals.

29. The method of claim 21, wherein the estimate of the magnetic resonance property is an estimate of $T_2$.

30. The method of claim 29, further comprising two characteristics of the estimate of $T_2$.

31. The method of claim 29, wherein the two characteristics are a goodness of fit to a reference curve and a measure of intensity.

32. A color imaging system comprising:
(a) a magnetic resonance scanner;
(b) a receiver, and
(c) a processor, wherein the processor receives signals containing magnetic resonance information obtained about a sample;
performs a transform of the signals to generate magnetic resonance data; and generates color image data using the magnetic resonance data, wherein the color image data reflect:

(i) an estimate of a magnetic resonance property of the sample; and (ii) a characteristic of the magnetic resonance property.

33. The system of claim 32, wherein the characteristic is selected to enhance the color image data.

34. The system of claim 33, wherein the characteristic is selected to enhance at least one region of a color image produced from the color image data.

35. The system of claim 34, wherein the at least one region is enhanced on the basis of at least one of hue, brightness, and saturation.

36. The system of claim 34, wherein the characteristic is selected to distinguish at least one region of the color image on the basis of the composition of the material in the corresponding region of the sample.

37. The system of claim 36, wherein the characteristic is selected to distinguish at least one region of the color image on the basis of the presence of material in the corresponding region of the sample.

38. The system of claim 36, wherein the characteristic is selected to distinguish at least one region of the color image on the basis of the homogeneity of material in the corresponding region of the sample.

39. The system of claim 32, wherein the magnetic resonance data are obtained using a Fourier transform of free induction decay signals.

40. The system of claim 32, wherein the estimate of the magnetic resonance property is an estimate of $T_2$.

41. The system of claim 40, further comprising two characteristics of the estimate of $T_2$.

42. The system of claim 41, wherein the two characteristics are a goodness of fit of the first data to a reference curve and a measure of intensity.

43. An article comprising a computer-readable medium on which a computer program is stored, the computer program comprising instructions for causing a processor to:

(a) receive signals containing magnetic resonance information about a sample;

(b) perform a transform of the signals to generate magnetic resonance data; and (c) generate color image data using the magnetic resonance data, wherein the color image data reflect:

(i) an estimate of $T_2$;

(ii) a measure of intensity; and (iii) a characteristic of goodness of fit of the estimate of $T_2$ to a curve for exponential decay.

* * * * *